(12) United States Patent
Morikawa

(10) Patent No.: US 9,669,996 B2
(45) Date of Patent: Jun. 6, 2017

(54) ARTICLE STORAGE FACILITY

(71) Applicant: Daifuku Co., Ltd., Osaka-shi (JP)

(72) Inventor: Yasushi Morikawa, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/091,662

(22) Filed: Apr. 6, 2016

(65) Prior Publication Data
US 2016/0289002 A1 Oct. 6, 2016

(30) Foreign Application Priority Data

Apr. 6, 2015 (JP) .................................. 2015-077897

(51) Int. Cl.
| | |
|---|---|
| *H01L 21/67* | (2006.01) |
| *H01L 21/68* | (2006.01) |
| *B66F 9/075* | (2006.01) |
| *B65G 1/04* | (2006.01) |
| *B65G 1/137* | (2006.01) |
| *B66F 9/24* | (2006.01) |

(52) U.S. Cl.
CPC ........... *B65G 1/0421* (2013.01); *B65G 1/137* (2013.01); *B66F 9/0755* (2013.01); *B66F 9/24* (2013.01); *H01L 21/67259* (2013.01); *H01L 21/68* (2013.01); *H01L 21/681* (2013.01); *B65G 2201/0297* (2013.01)

(58) Field of Classification Search
CPC .......... B66F 9/0755; B66F 9/24; H01L 21/68; H01L 21/681; H01L 21/67259
See application file for complete search history.

(56) References Cited

U.S. PATENT DOCUMENTS

| | | | | | |
|---|---|---|---|---|---|
| 5,586,158 | A | * | 12/1996 | Iwama | ................... G21C 19/20 376/248 |
| 5,645,391 | A | * | 7/1997 | Ohsawa | ............ H01L 21/67778 414/416.03 |
| 6,845,292 | B2 | * | 1/2005 | Sha | ................... H01L 21/67259 414/936 |

(Continued)

FOREIGN PATENT DOCUMENTS

| | | |
|---|---|---|
| JP | 2001225909 A | 8/2001 |
| JP | 201083593 A | 4/2010 |

*Primary Examiner* — Thomas Randazzo
(74) *Attorney, Agent, or Firm* — The Webb Law Firm

(57) ABSTRACT

A control portion is configured to execute a preliminary movement process of causing a movement mechanism to execute a preliminary movement operation of moving the movement support body with an imaging device attached thereto to a preliminary target stop position that is preset as a target stop position and stopping the movement support body at the preliminary target stop position; an imaging process of causing the imaging device to image an imaging target location in a state in which the movement support body is stopped at the preliminary target stop position; an offset amount calculation process of calculating, based on a captured image obtained by the imaging process, a positional offset amount of the movement support body in a front-rear direction and a lateral direction from a proper position of the movement support body; and a correction process of correcting the preliminary target stop position based on the positional offset amount calculated by the offset amount calculation process and setting the target stop position.

5 Claims, 9 Drawing Sheets

(56) References Cited

U.S. PATENT DOCUMENTS

| | | | |
|---|---|---|---|
| 7,010,404 B2 * | 3/2006 | Ichijo | B66F 9/0755 382/103 |
| 7,320,385 B2 * | 1/2008 | Katae | B66F 9/24 187/222 |
| 7,341,187 B2 * | 3/2008 | Murayama | B65G 1/0421 235/385 |
| 7,408,314 B2 * | 8/2008 | Hayashi | B60L 3/0038 187/222 |
| 8,189,867 B2 * | 5/2012 | Yoshioka | G06K 9/6253 348/143 |
| 8,854,449 B2 * | 10/2014 | Aikawa | C23C 16/44 348/87 |
| 9,056,719 B2 * | 6/2015 | Tanahashi | B65G 1/0421 |
| 9,171,278 B1 * | 10/2015 | Kong | G06Q 10/087 |
| 2016/0125589 A1 * | 5/2016 | Tertitski | G06T 7/0004 382/151 |

* cited by examiner

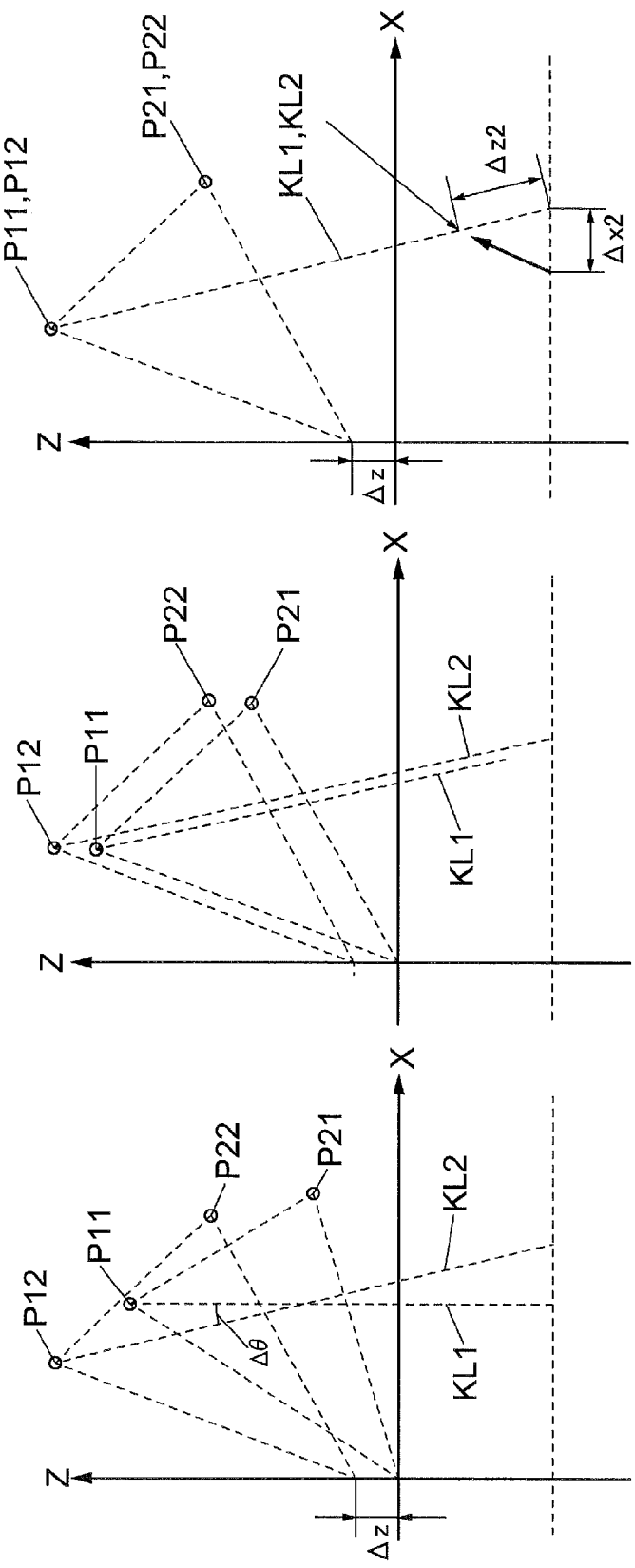

ARTICLE STORAGE FACILITY

CROSS-REFERENCE TO RELATED APPLICATION

This application claims priority to Japanese Patent Application No. 2015-077897 filed Apr. 6, 2015, the disclosure of which is hereby incorporated in its entirety by reference.

FIELD OF THE INVENTION

The present invention relates to an article storage facility including an article storage rack including a plurality of storage sections arranged in a vertical direction and a lateral direction, each of the storage sections including a storage support body that supports an article from below; a movement support body that supports the article; a movement mechanism that moves the movement support body in the vertical direction and the lateral direction in a movement space provided along a front of the article storage rack, and moves the movement support body along a front-rear direction that is a direction of arrangement of the movement space and the article storage rack; and a control portion that controls the movement mechanism.

BACKGROUND

In an article storage facility as described above, the control portion causes the movement mechanism to execute a movement operation of moving the movement support body to a target stop position that is set so as to correspond to each of the plurality of storage sections and stopping the movement support body at the target stop position, and a transfer operation of lowering the movement support body at the target stop position and delivering the article to the storage support body. The target stop position needs to be set at a proper position that is a position of the movement support body at which the article supported by the movement support body can be delivered to a proper storage position of the storage support body by the transfer operation. However, the positions of the storage support bodies of the plurality of storage sections will be slightly shifted from the design positions due to an installation error occurring during installation of the facility. Accordingly, even when a movement support body is located at the target stop position that is provided by design, the movement support body may not be located at a proper position relative to the actually installed storage support body.

For this reason, for example, JP 2010-83593A (Patent Document 1) discloses a technique for attaching a target mark at a specific location of the storage support body of each storage section, imaging the target mark from the front side of the storage section with a pair of imaging devices supported by the movement support body in an orientation in which their imaging directions intersect each other, calculating, based on two images of the imaged target mark, the positional offset amount in the vertical direction and the positional offset amount in the lateral direction, and the front-rear direction between the movement support body and the storage support body, and correcting the target stop position based on the positional offset amounts.

However, the technique disclosed by Patent Document 1 corrects the position of the storage support body based on the positions of the target mark in the images captured from the front side of the storage section, and thus has the following problem.

That is, due to the constraint that the target mark must be provided at such a position that supporting of an article by the storage support body will not be obstructed, the set position of the target mark must be a position away from a position of the storage support body at which the article is supported. Accordingly, it is not possible to directly measure the position of the article supporting portion of the actually attached storage support body, and there is the possibility that the corrected target stop position may be shifted from the proper position relative to the storage support body.

In particular, even if the orientation of the actually installed storage support body in plan view is an offset orientation shifted from the design orientation, when that offset is an offset in the rotational direction about the target mark in plan view, the offset amount in this plan view orientation will not be reflected on the position of the target mark. Accordingly, no matter how accurately the position of the target mark of the actually attached storage support body can be measured, when the plan view orientation of the storage support body is shifted from the design orientation, it is not possible to know the position of the article supporting portion of the storage support body, making it impossible to appropriately correct the target stop position.

Moreover, since all of the images captured from different imaging directions in Patent Document 1 are images resulting from imaging the target mark from the front side of the storage section, the position of the target mark in the front-rear direction cannot be measured as accurately as the positions in the lateral direction and the vertical direction. Accordingly, in the case of measuring the positional offsets in the lateral direction, the vertical direction, and the front-rear direction from the proper position when the movement support body is located at the target stop position, the positional offsets in the lateral direction and the vertical direction can be accurately calculated, but the positional offset in the front-rear direction cannot be calculated as accurately as the positional offsets in the lateral direction and the vertical direction. Consequently, the target stop position cannot be corrected to a proper position in the front-rear direction.

Meanwhile, JP 2001-225909A (Patent Document 2) describes a technique for measuring proper positions in the lateral direction and the front-rear direction relative to a storage support body that is actually supporting an article. According to the technique described in Patent Document 2, the proper positions of the movement support body in the lateral direction and the front-rear direction are acquired by attaching a jig plate having a target mark attached thereto to a storage support body in a state in which the position relative to the storage support body in plan view is constant, and detecting the target mark with a detection device provided in the movement support body.

In Patent Document 2, in the case of acquiring the target stop positions for the lateral direction and the front-rear direction, the jig plate is attached to a proper storage position of the storage support body for which the target position is to be acquired, and the target mark attached to the jig plate is detected with the detection device mounted to the movement support body, and thereby, the positions in the lateral direction and the front-rear direction from among the target stop positions of the movement support body are acquired.

SUMMARY OF THE INVENTION

According to the technique of Patent Document 2, the operator must attach the jig plate to the target storage support body before the acquisition of the proper position of the movement support body relative to the storage support body, and remove the jig plate after the acquisition of the proper position has ended.

Also, such an operation must be repeated for the number of times corresponding to the number of storage support bodies for which the proper positions are to be acquired. Therefore, when the article storage rack includes a large number of storage sections, the amount of operation of attaching and removing the jig plate will be enormous. Furthermore, when the storage sections are present at a high place, it is difficult to perform the operation of attaching the jig plate to the storage support body.

Therefore, there is a need for an article storage facility that allows the target stop position of the movement support body relative to the storage support body to be corrected to the proper position, while minimizing the burden on the operator.

An article storage facility according to the present disclosure is characterized by including: an article storage rack including a plurality of storage sections arranged in a vertical direction and a lateral direction, each of the storage sections including a storage support body that supports an article from below; a movement support body that supports the article; a movement mechanism that moves the movement support body in the vertical direction and the lateral direction in a movement space provided along a front of the article storage rack, and moves the movement support body along a front-rear direction that is a direction of arrangement of the movement space and the article storage rack; and a control portion that controls the movement mechanism; wherein the control portion is configured to cause the movement mechanism to execute a movement operation of moving the movement support body to a target stop position that is set so as to correspond to each of the plurality of storage sections and stopping the movement support body at the target stop position, and a transfer operation of lowering the movement support body at the target stop position and delivering the article to the storage support body, the movement support body is configured such that an imaging device can be removably attached thereto, the imaging device is configured to, in a state in which the movement support body is at the target stop position, be controlled by the control portion so as to image from above an imaging target location that is set in the storage support body of the storage section corresponding to said target stop position, and the control portion is configured to execute: a preliminary movement process of causing the movement mechanism to execute a preliminary movement operation of moving the movement support body with the imaging device attached thereto to a preliminary target stop position that is preset as the target stop position and stopping the movement support body at the preliminary target stop position; an imaging process of causing the imaging device to image the imaging target location in a state in which the movement support body is stopped at the preliminary target stop position; an offset amount calculation process of calculating, based on a captured image obtained by the imaging process, a positional offset amount of the movement support body in the front-rear direction and the lateral direction from a proper position of the movement support body that is a position at which the article supported by the movement support body can be delivered to a proper storage position of the storage support body by the transfer operation; and a correction process of correcting the preliminary target stop position based on the positional offset amount calculated by the offset amount calculation process and setting the target stop position.

That is, the control portion executes the offset amount calculation process of calculating the positional offset amounts in the front-rear direction and the lateral direction of the movement support body from the proper position based on the captured image of the imaging target location imaged from above, with the movement support body to which the imaging device is mounted being stopped at the preliminary target stop position. Accordingly, in contrast to a configuration in which a target mark provided at the storage support body is imaged from the front of the article storage rack and the positional offset amounts in the front-rear direction and the lateral direction of the storage support body are detected based on the captured image, the imaging target location can include, for example, a portion of the storage support body at which an article is supported at the proper storage position, making it possible to accurately calculate the offset amount between the position and orientation in plan view of the storage support body that are defined by the preliminary target stop position and the position and orientation in plan view of the storage support body in the actually attached state.

Moreover, unlike Patent Document 2, it is not necessary to attach or remove the jig plate to or from the plurality of storage sections, and therefore, the operator does not need to attach a detection target jig to each storage support body, thus making it possible to reduce the burden on the operator.

Also, since the preliminary target stop position is corrected based on the positional offset amount that has been calculated accurately in the above-described manner, and the target stop position is set, it is possible to correct the target stop position to a position at which the movement support body can be located at the proper position.

In this way, it is possible to provide an article storage facility that can calculate the positional offset amount of the movement support body relative to the storage support body and correct the target stop position, while minimizing the burden on the operator.

BRIEF DESCRIPTION OF THE DRAWINGS

FIG. 13 is a conceptual diagram showing a method for calculating a positional offset amount in a positional offset amount calculation process;

FIG. 14 is a conceptual diagram showing a method for calculating a positional offset amount in the positional offset amount calculation process;

FIG. 15 is a conceptual diagram showing a method for calculating a positional offset amount in the positional offset amount calculation process;

DETAILED DESCRIPTION

Hereinafter, an embodiment of an article storage facility will be described with reference to the drawings.

Figure 1:
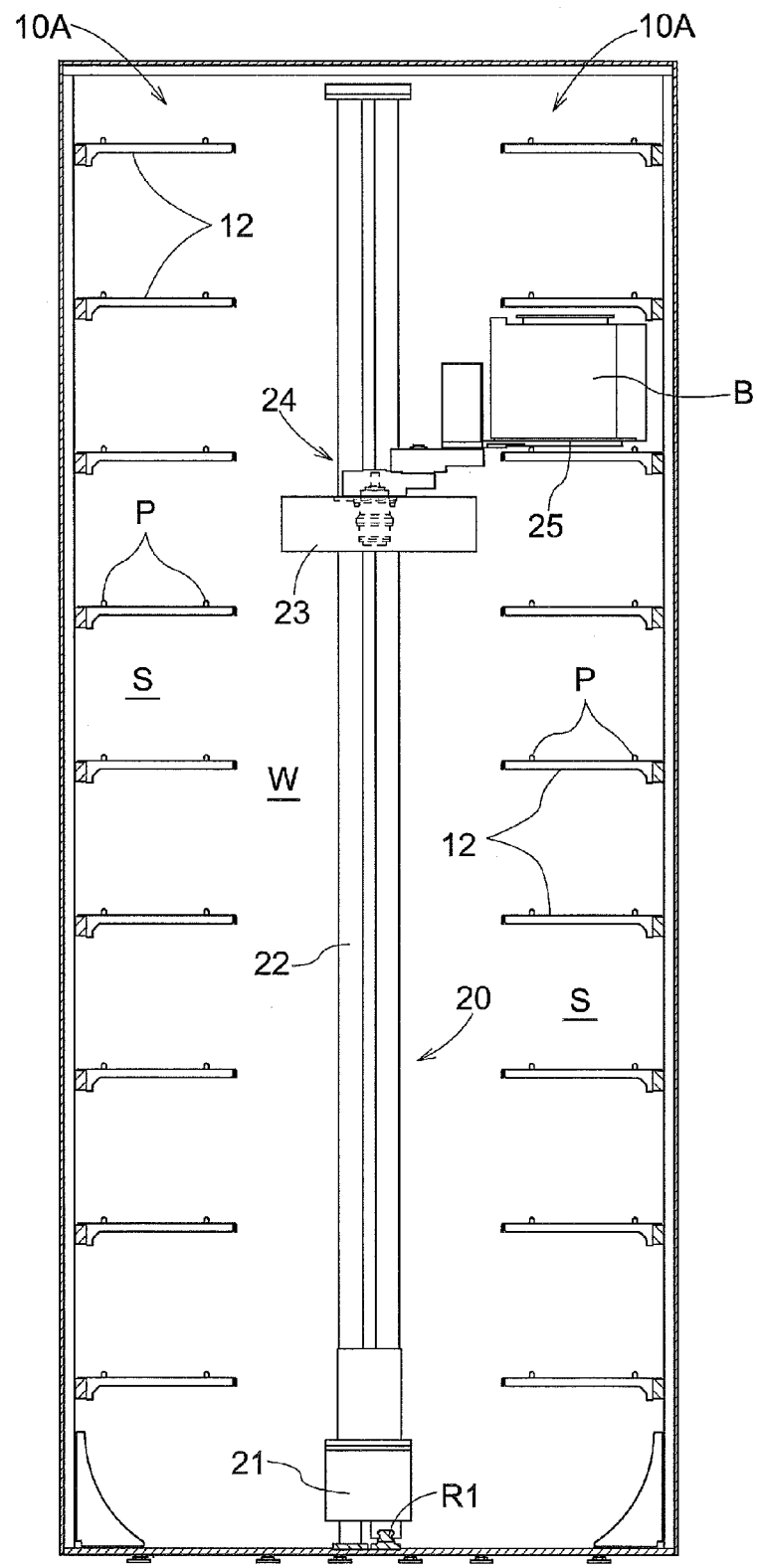
FIG. 1 is a front cross-sectional view of an article storage facility.

As shown in FIG. 1, the article storage facility is provided with article storage racks 10A each including a plurality of storage section S arranged in a vertical direction and a lateral direction, and a stacker crane 20 capable of moving in a movement space W located on the front side of the article storage racks 10A. Note that each storage section S includes a storage support body 12 that supports from below a container B (an exemplary article), which is referred to as a FOUP, accommodating a plurality of semiconductor substrates. Also, the stacker crane 20 includes a transfer fork 25 capable of transferring the container B to and from the storage support body 12.

Figure 2:
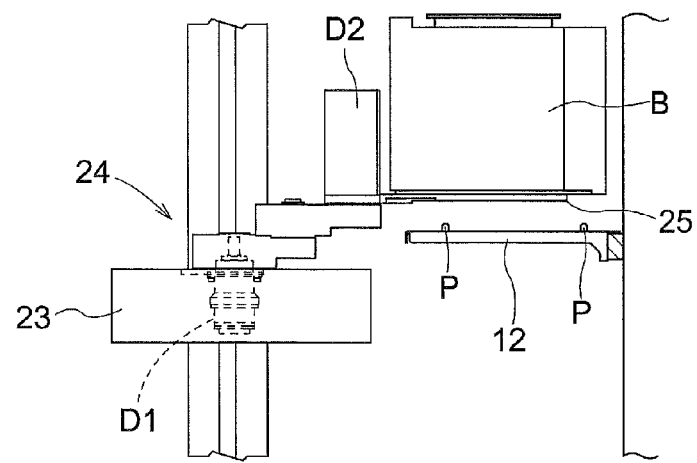
FIG. 2 is a diagram illustrating delivery (unloading) of an article performed by a transfer fork.

As shown in FIGS. 1 and 2, the stacker crane 20 includes a carriage portion 21 that travels on a traveling rail R1 provided on the front side of the article storage racks 10A along the lateral direction, an elevation mast 22 provided upright on the carriage portion 21, and an elevation body 23 capable of being raised and lowered along the elevation mast 22. Also, the transfer fork 25 is supported by the elevation body 23, and is configured to be capable of being extended and retracted relative to the elevation body 23 by a SCARA arm 24.

Figure 5:
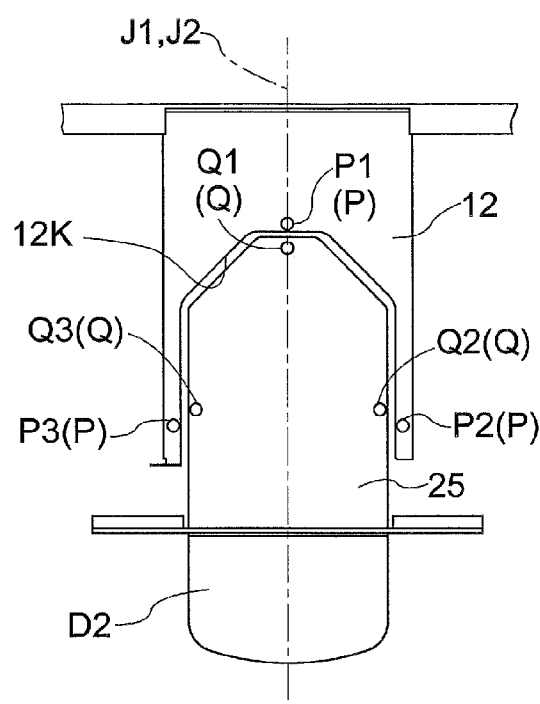
FIG. 5 is a diagram showing a relationship between a state of attachment of a storage support body and a proper position.
Figure 7:
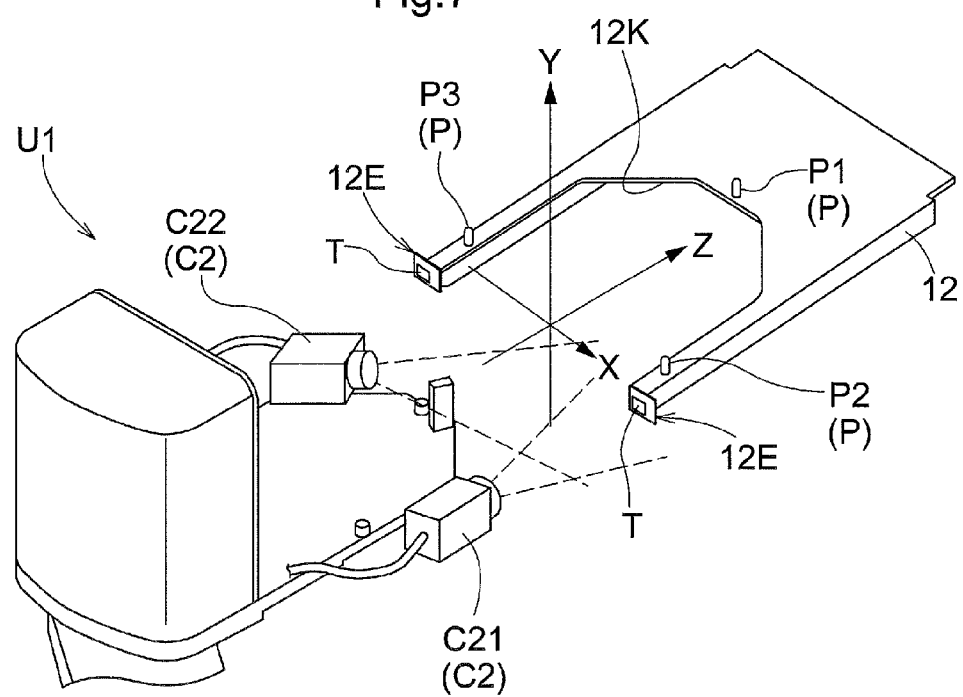
FIG. 7 is a diagram showing learning in an X direction and a Y direction performed by a pre-learning device.

As shown in FIG. 5, each storage support body 12 is configured by forming, in a member having a rectangular shape in plan view, a U-shaped cut-away portion 12K that is open on the movement space W side. Also, three positioning pins P that engage with positioning groove portions provided on the bottom of the container B are disposed so as to be distributed on the top surface side of the storage support body 12 and around the cut-away portion 12K. As shown in FIG. 7, a target mark T is attached to each of end portions 12E of the storage support body 12 on the opening side.

Figure 6:
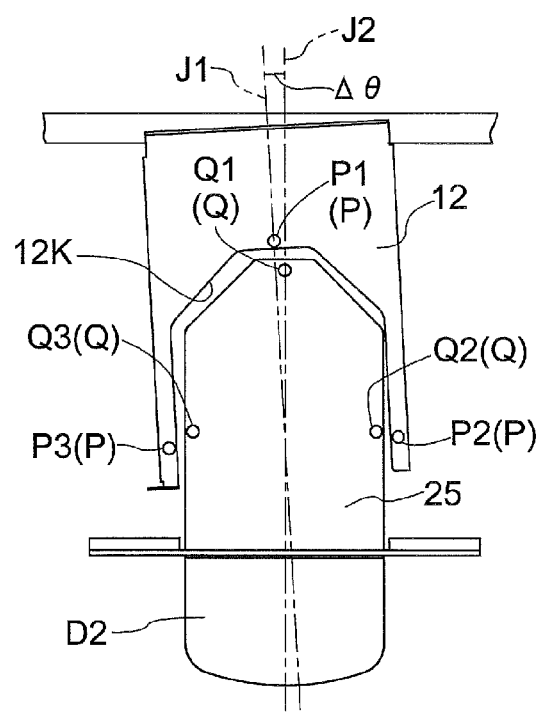
FIG. 6 is a diagram showing a relationship between a state of attachment of a storage support body and a proper position.

As shown in FIGS. 5 to 7, the positioning pins P include a third pin P3 that is located on the movement space W side in the front-rear direction (Z direction in FIG. 7), which is the direction of arrangement of the article storage racks 10A and the movement space W, and is also located on the left side of the region in which the cut-away portion 12K is present in the lateral direction, a second pin P2 that is located on the movement space W side in the front-rear direction and is also located on the right side of the cut-away portion 12K in the lateral direction, and a first pin P1 that is located on the deeper side away from the movement space W in the front-rear direction and is also located substantially at the center of the region in which the cut-away portion is present in the lateral direction.

Although not shown, a first groove portion that engages with the first pin P1, a second groove portion that engages with the second pin P2, and a third groove portion that engages with the third pin P3 when the container B is supported by the storage support body 12 are formed on the bottom of each container B, and the container B is positioned at a predetermined position (proper storage position) in plan view relative to the storage support body 12 through engagement between the three groove portions and the first to third pins P1 to P3. In the present embodiment, the positioning pins P (first to third pins P1 to P3) correspond to the positioning members. That is, the storage support body 12 includes a plurality of positioning pins P for positioning the container B at the proper storage position, and the plurality of positioning pins P are disposed so as to be distributed in plan view.

Furthermore, although not shown, a connection portion including a hole portion for introducing an inactive gas into each container B is provided on the bottom surface of the container B, and an inactive gas supply portion that is connected to the connection portion of the container B in the supported orientation so as to supply the inactive gas is provided on the top surface of the storage support body 12.

The inactive gas supply portion is provided with a buffer member formed of, for example, a silicone resin, and is configured to absorb an impact caused when the connection portion and the inactive gas supply portion come into contact with each other during delivery of the container B.

As shown in FIG. 5, positioning pins Q are disposed so as to be distributed on the top surface of the transfer fork 25. The positioning pins Q are composed of a first pin Q1 that engages with the first groove portion, a second pin Q2 that engages with the second groove portion, and a third pin Q3 that engages with the third groove portion. The transfer fork 25 is configured to support the container B in a state in which the container B is positioned at a proper supporting position of the transfer fork 25 by the positioning pins Q.

Figure 8:
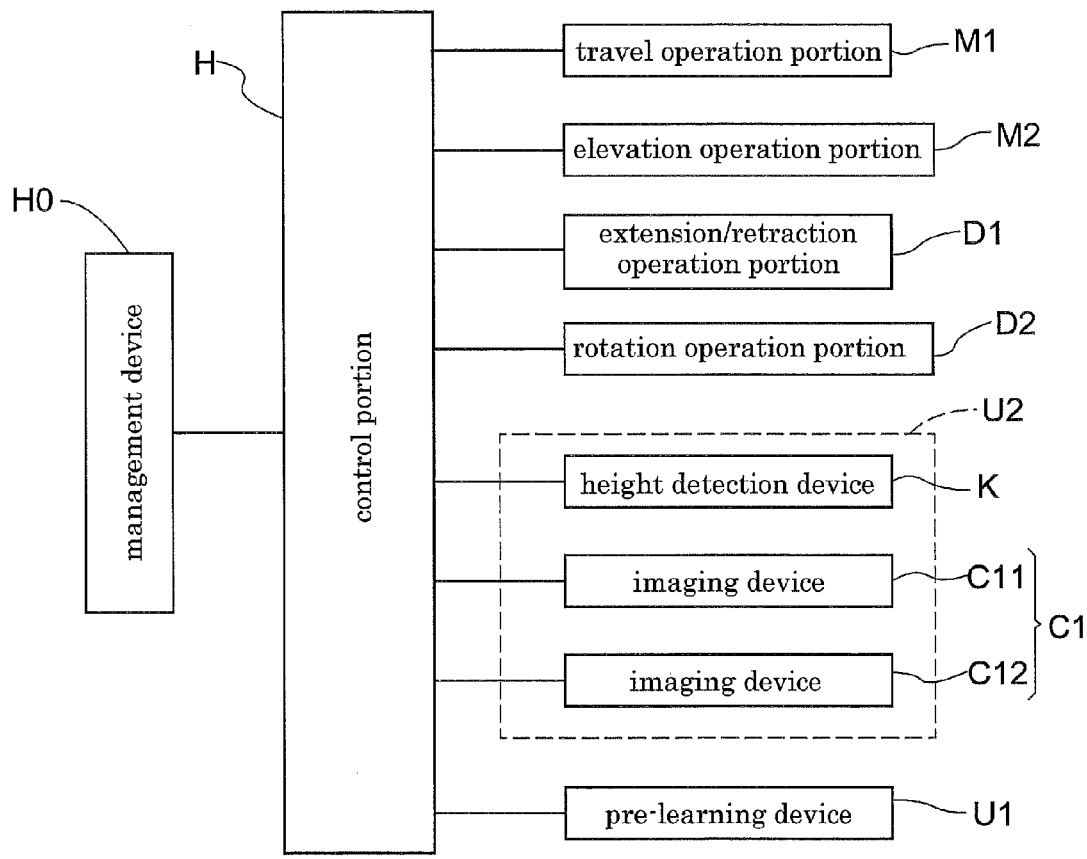
FIG. 8 is a control block diagram.

As shown in FIG. 8, the stacker crane 20 is provided with a travel operation portion M1 that operates the carriage portion 21 to travel, an elevation operation portion M2 that operates the elevation body 23 to be raised and lowered, an extension/retraction operation portion D1 that operates the SCARA arm 24 to move the transfer fork 25 so as to be extended and retracted in the front-rear direction, and a rotation operation portion D2 that operates the transfer fork 25 to be rotated about a rotational shaft extending along the vertical direction and provided at the distal end of the SCARA arm 24. The travel operation portion M1, the elevation operation portion M2, the extension/retraction operation portion D1, and the rotation operation portion D2 are connected to a control portion H that controls the operation of the stacker crane 20, and their operations are controlled by the control portion H. Note that, from each of the travel operation portion M1, the elevation operation portion M2, the extension/retraction operation portion D1 and the rotation operation portion D2, feedback information indicating the operation amount thereof has been input to the control portion H, allowing the control portion H to operate the travel operation portion M1, the elevation operation portion M2, the extension/retraction operation portion D1, and the rotation operation portion D2 by the necessary operation amount.

In the present embodiment, the transfer fork 25 corresponds to the movement support body, and the travel operation portion M1, the elevation operation portion M2, the extension/retraction operation portion D1, and the rotation operation portion D2 that are included in the stacker crane 20 correspond to the movement mechanism. That is, there are provided the movement mechanism that moves the transfer fork 25 in the vertical direction (Y direction) and the lateral direction (X direction) in the movement space W provided along the front side of the article storage racks 10A and moves the transfer fork 25 along the front-rear direction (Z direction), which is the direction of arrangement of the movement space W and the article storage racks 10A, and the control portion H that controls the movement mechanism.

Also, as shown in FIG. 8, a management device HO that instructs to transport the container B into or out of the storage section S is communicably connected to the control portion H. In addition, detection information from a height detection device K such as a laser range finder included in a learning device U2, which will be described later, and captured images from a first imaging device C11 and a second imaging device C12 are input to the control portion H. Furthermore, captured images from a first imaging device C21 and a second imaging device C22 included in a pre-learning device U1, which will be described later, are input to the control portion H.

Furthermore, the control portion H stores, in a database it retains, the position of the transfer fork 25 in each of the X direction, the Y direction, and the Z direction when a container B is delivered to the storage support body 12 of each of the storage sections S included in the article storage racks 10A in association with that storage section S. Hereinafter, the position of the transfer fork 25 in each of the X direction, the Y direction, and the Z direction stored in the database in association with the storage section S is referred to as "DB stored position".

Then, in the case of delivering (unloading) the container B from the transfer fork 25 to the storage support body 12, the control portion H controls the movement mechanism so as to operate the travel operation portion M1 and the elevation operation portion M2 to move the transfer fork 25 by using the DB stored position as the target stop position to cause the transfer fork 25 to be located on the front side of the storage section S to which the container B is to be delivered, and thereafter operate the extension/retraction operation portion D1 to cause the transfer fork 25 to protrude to the storage section S side, as shown in FIG. 2. That is, the control portion H causes the movement mechanism to execute a movement operation of moving the transfer fork 25 to the target stop position that is set so as to correspond to each of the plurality of storage sections S, and stopping the transfer fork 25 at that target stop position.

Figure 3:
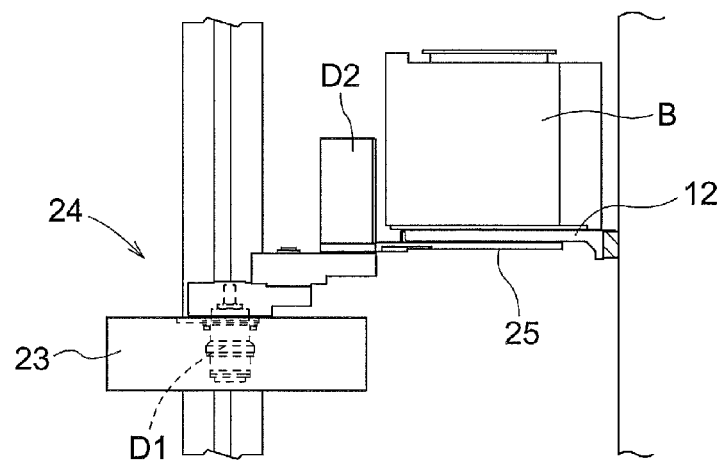
FIG. 3 is a diagram illustrating delivery (unloading) of an article performed by a transfer fork.
Figure 4:
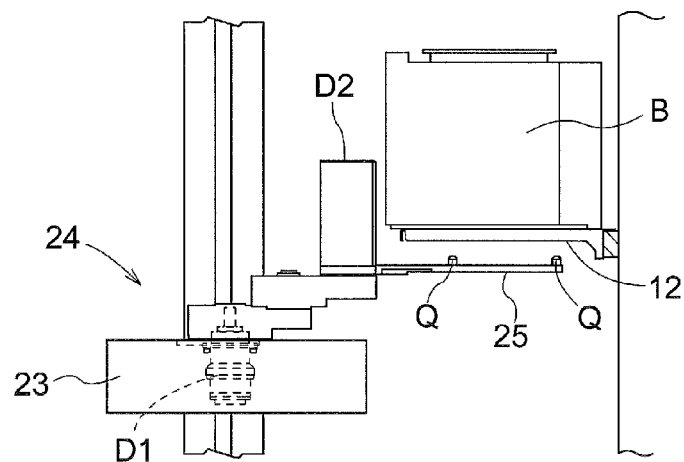
FIG. 4 is a diagram illustrating delivery (unloading) of an article performed by a transfer fork.

Subsequently, as shown in FIG. 3, the control portion H delivers the container B to the storage support body 12 by lowering the transfer fork 25 to the position shown in FIG. 4 at the target stop position. That is, the control portion H causes the movement mechanism to execute a transfer operation of lowering the transfer fork 25 at the target stop position and delivering the container B to the storage support body 12.

Meanwhile, the above-described DB stored position is set as a design target stop position, based on the assumption that the storage support body 12 is attached to a vertical strut of the article storage rack 10A in a proper state.

When the target stop position is set to the DB stored position, if the DB stored position is proper, the proper positional relationship between the transfer fork 25 located at the DB stored position and the storage support body 12 in plan view is such that an axis J1 about which the positioning pins P are arranged bilaterally symmetrical in plan view and an axis J2 about which the positioning pins Q are arranged bilaterally symmetrical in plan view overlap, as shown in FIG. 5. When this positional relationship is achieved, the container B supported by the transfer fork 25 can be delivered to the proper storage position of the storage support body 12 by the transfer operation. This position of the transfer fork 25 is referred to as "proper position".

On the other hand, as shown in FIG. 6, when the storage support body 12 is not attached to the vertical strut in the above-described proper state due to, for example, a poor attachment precision of the storage support body 12, or in other words, the axis J1 and the axis J2 are inclined to each other by an angle Δθ in plan view, the position of the transfer fork 25 in each of the X direction, the Y direction, and the Z direction at which the container B supported by the transfer fork 25 can be actually delivered to the proper storage position of the storage support body 12 by the transfer operation may be shifted from the DB stored position. In the case of delivering the container B supported by the transfer fork 25 to the storage support body 12 while such a shift is occurring, the container B will be guided to the proper storage position by the positioning groove portions included in the container B. However, there is the possibility that, in the course of guiding the container B to the proper storage position, vibrations may occur, or the buffer member of the inactive gas supply portion may undergo abrasion, resulting in generation of impurity particles.

Therefore, in the present embodiment, for each of the storage sections S, if the position of the transfer fork 25 stopped at the target stop position is shifted from the proper position, the amount of that positional offset is calculated, and the target stop position is corrected. Hereinafter, correcting the target stop position in this manner is referred to as "learning". The control portion H is configured to be able to execute "learning operation" of performing learning in a predetermined order, for all the storage sections S included in the article storage racks 10A.

Figure 9:
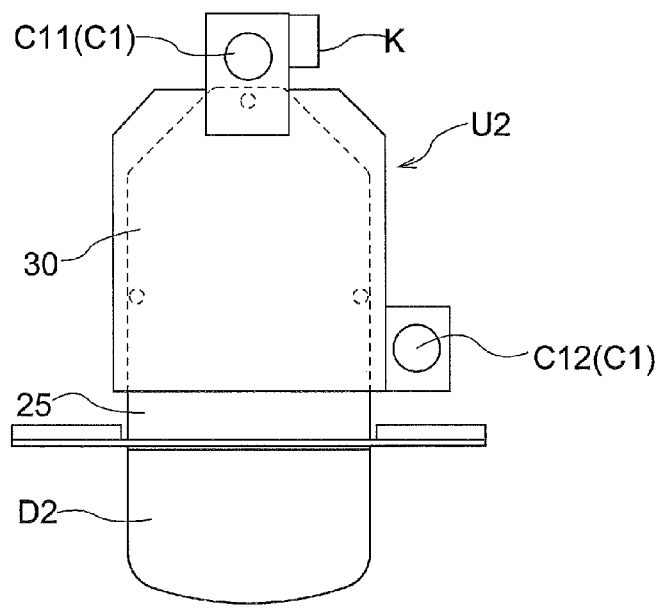
FIG. 9 is a plan view of a learning device.
Figure 10:
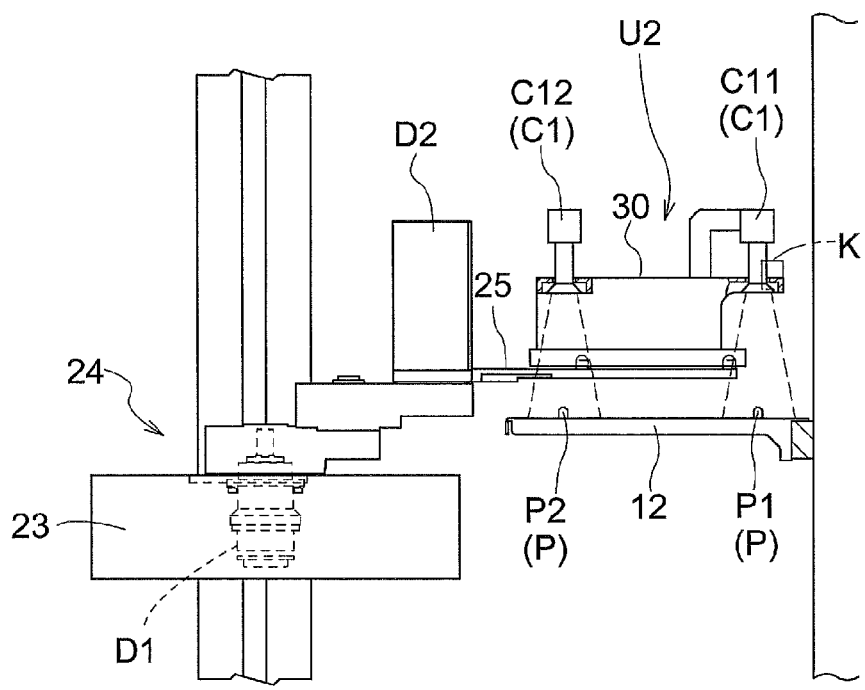
FIG. 10 is a side view showing a state in which an imaging process is executed by an imaging device included in the learning device.
Figure 11:
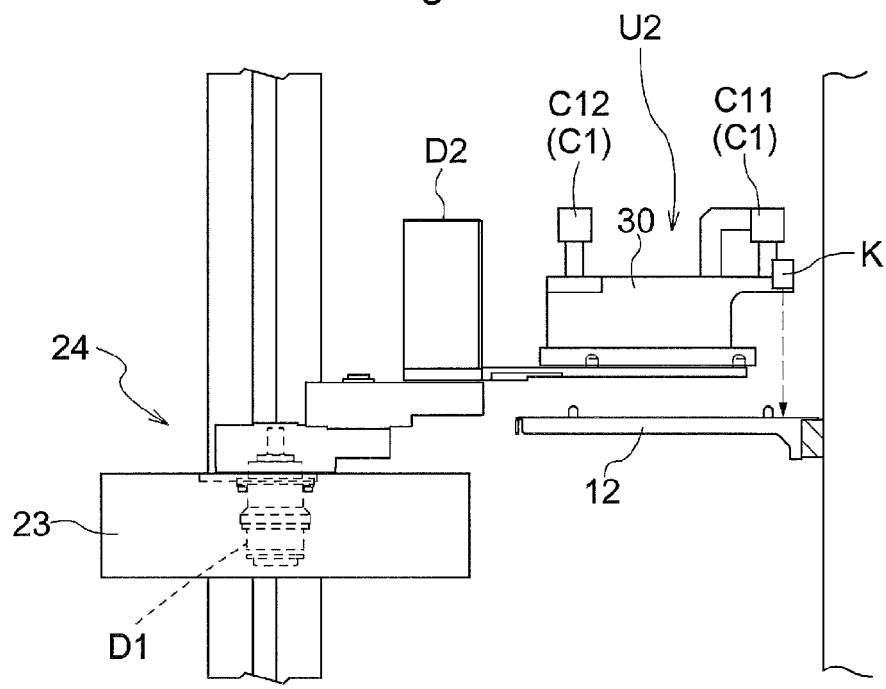
FIG. 11 is a side view showing a state in which a vertical distance is measured by a height measuring instrument included in the learning device.

At the time of learning, a pre-learning device U1 shown in FIG. 7 and a learning device U2 shown in FIGS. 9 to 11 are used. As shown in FIG. 7, the pre-learning device U1 includes a first imaging device C21 that images the storage support body 12 of the storage section S from the front, and a second imaging device C22 that images the same location as the first imaging device C21 from an inclined direction in plan view. The pre-learning device U1 is configured to be mountable to the transfer fork 25 while being positioned relative to the transfer fork 25 by the positioning pins Q.

Also, as shown in FIGS. 9 to 11, the learning device U2 includes a base portion 30 to which a first imaging device C11 that images from above the first pin P1 (target positioning member) provided on the top surface of the storage support body 12, a second imaging device C12 that images from above the second pin P2 (target positioning member) provided on the top surface of the storage support body 12, and a height detection device K that measures the distance to the top surface of the storage support body 12 are attached in a fixed state. The base portion 30 is configured to be mountable to the transfer fork 25 while being positioned relative to the transfer fork 25 by the positioning pins Q. In the present embodiment, the first imaging device C11 and the second imaging device C12 of the learning device U2 correspond to the imaging device C1, and the height detection device K corresponds to the vertical distance measurement portion. That is, the transfer fork 25 is configured such that the imaging device C1 can be removably attached thereto, and the imaging device C1 is configured to, in a state in which the transfer fork 25 is located at that target stop position, be controlled by the control portion H so as to image from above the positioning pins P (target positioning members) serving as an imaging target location set in the storage support body 12 of the storage section S corresponding to that target stop position. Also, the transfer fork 25 includes the height detection device K of a laser range-finding type that measures a vertical distance that is a distance in the vertical direction between the transfer fork 25 located at the target stop position and the storage support body 12.

As the learning operation, first, the pre-learning device U1 is mounted to the transfer fork 25, and a pre-learning process of determining an X coordinate and a Y coordinate of the target stop position for each of the storage sections S is executed. Note that at the time of mounting the pre-learning device U1 to the transfer fork 25, a communication cable and a power supply cable are connected between the control portion H and a connector included in the transfer fork 25, but the description thereof shall be omitted here. After the pre-learning device U1 has been mounted to the transfer fork 25, the control portion H executes, for all storage sections S, a pre-learning process of moving the transfer fork 25 in the X direction and the Y direction, imaging the target marks T attached to the opening end portions 12E of the storage support body 12 by the first imaging device C21 and the second imaging device C22, and determining, based on captured images therefrom, the position in the X direction and the position in the Y direction from among the positions (coordinates) in the X direction, the Y direction, and the Z direction of the target stop position. The positions in the X direction and the Y direction determined by the pre-learning process are stored in the database so as to overwrite the positions in the X direction and the Y direction in the DB stored position.

Upon completion of the pre-learning process, the control portion H subsequently executes a final learning process. The final learning process is executed, with the learning device U2 being mounted to the transfer fork 25. Note that at the time of mounting the learning device U2 to the transfer fork 25, a communication cable and a power supply cable are connected between the control portion H and a connector included in the transfer fork 25, but the description thereof shall be omitted here.

Figure 12:
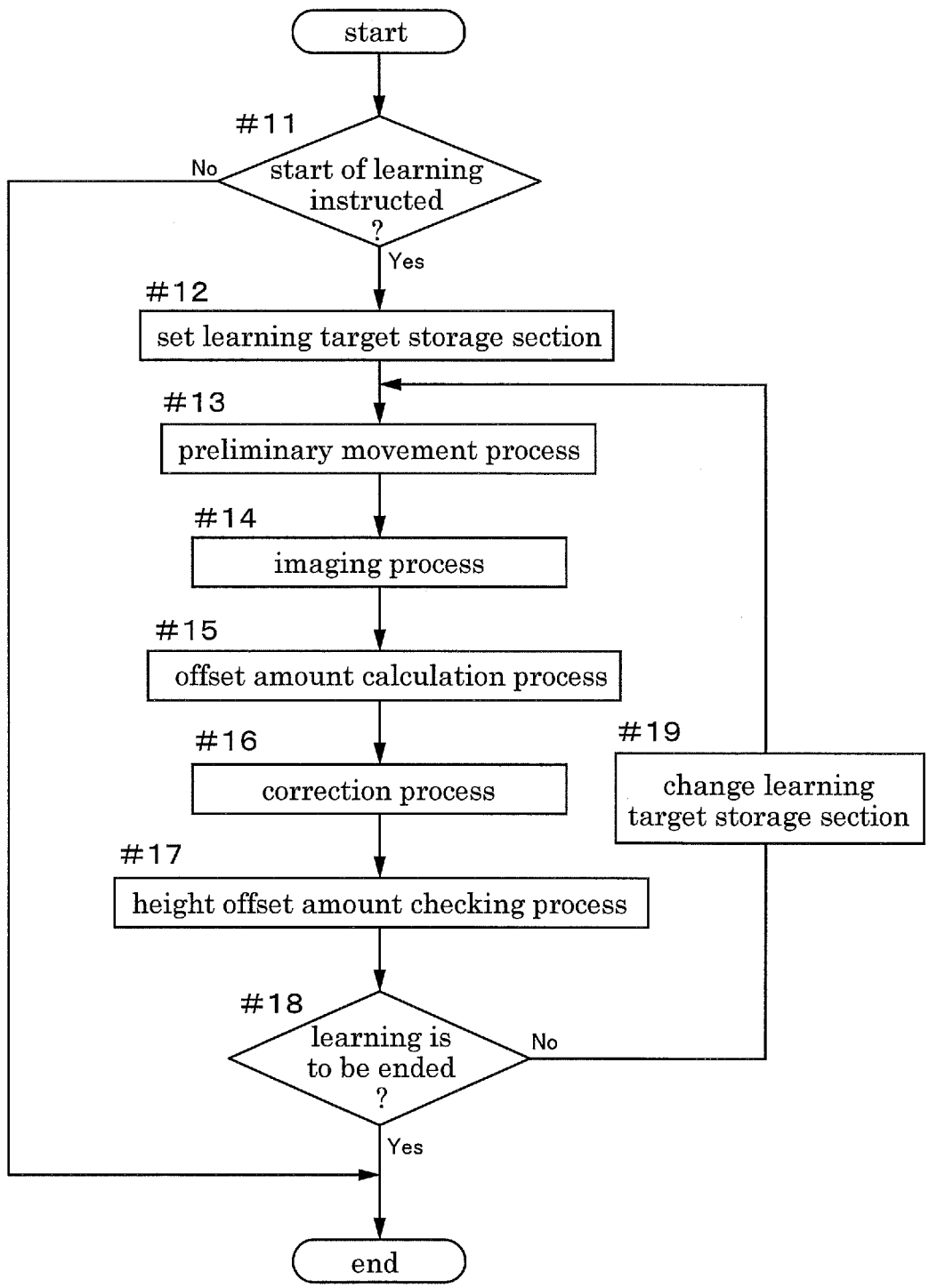
FIG. 12 is a flowchart showing a learning operation.

In the following, the control in the final learning process will be described with reference to the flowchart shown in FIG. 12.

When the start of learning in the final learning process is instructed (#11: Yes), the control portion H sets a storage section S for which learning is to be performed (referred to as "learning target storage section") (#12). Then, the control portion H executes, by using, as a preliminary target stop position, a position to which a learning set height (e.g., about 2 to 5 cm) in the Y direction is added to the DB stored position corresponding to the learning target storage section as the target stop position, a preliminary movement process of causing the movement mechanism to execute a preliminary movement operation of moving the transfer fork 25 to the preliminary target stop position and stopping the transfer fork 25 at the preliminary target stop position (#13).

The control portion H is configured to, as the preliminary movement process, execute a process (first movement process) of moving the transfer fork 25 in the Y direction and the X direction, and thereafter execute a process (second movement process) of moving that transfer fork 25 in the Z direction.

Subsequently, the control portion H executes an imaging process of causing the imaging device C1 to image the imaging target location in a state in which the transfer fork 25 is stopped at the preliminary target stop position (#14).

Then, the control portion H executes an offset amount calculation process of calculating the positional offset amount of the transfer fork 25 from the proper position in the Z direction and the X direction, based on the actual positions of the positioning pins P in the captured images obtained by the imaging process at #14 and the positions of the positioning pins P in the captured images imaged by the imaging device C1 when the transfer fork 25 is located at the proper position (#15). Here, the proper position refers to a position of a transfer fork 25 at which the container B supported by the transfer fork 25 can be delivered to the proper storage position of the storage support body 12 by the transfer operation. At the time of executing the offset amount calculation process, pattern matching is performed for the captured images, but the method of pattern matching is known and thus the description thereof shall be omitted here.

Subsequently, the control portion H executes a correction process of correcting the preliminary target stop position based on the positional offset amount calculated by the offset amount calculation process and setting a target stop position, overwriting the DB stored position with the value of the target stop position, and storing the DB stored position in the database (#16).

Figure 17:
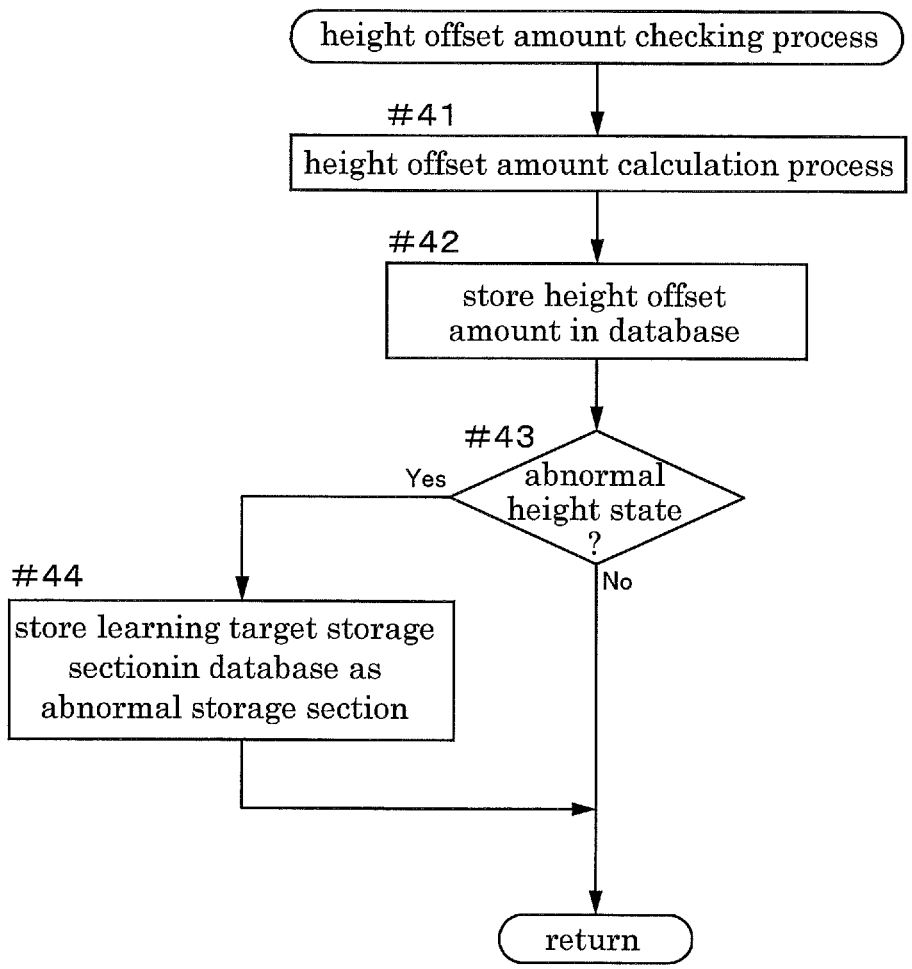
FIG. 17 is a flowchart showing a height offset amount checking process.

Also, subsequently to the correction process, the control portion H executes a height offset amount checking process shown in FIG. 17 (#17). As shown in FIG. 17, the height offset amount checking process executes a height offset amount calculation process (#41) of calculating, based on information on a height from the top surface of the storage support body 12 that has been detected by the height detection device K, a height offset amount that is a difference between a proper distance that is a distance in the vertical direction between the transfer fork 25 located at the proper position and the storage support body 12 and a vertical distance measured by the height detection device K in a state in which the transfer fork 25 is located at the preliminary target stop position by the preliminary movement operation, and storing the height offset amount in association with identification information of the storage section S (#42). If the height offset amount calculated by the height offset amount calculation process is in an abnormal height state that is greater than an allowable amount (#43: Yes), the control portion H determines that the state of attachment of the storage support body 12 of the storage section is abnormal, and stores an indication to disable the storage section S in the database (#44). If the height offset amount is not in the abnormal height state and when the process at #44 ends, the procedure exits the routine of the height offset amount checking process, and returns to the original routine.

Thereafter, the control portion H determines whether or not learning is to be ended (#18). Note that learning is ended when the condition that learning has been completed for all storage sections S, the condition that learning for storage section S that are designated as the learning target has been ended, or the like is satisfied. If it is determined at #18 that learning is to be ended (#18: Yes), the learning operation ends. If it is determined that the learning operation is not to be ended (#18: No), the learning target storage section S is changed to the next scheduled storage section in a predetermined order (#19), and the procedure subsequently returns to the preliminary movement process at #13. If the start of learning is not instructed at #11 (#11: No), the process ends.

Here, an outline of the offset amount calculation process will be described with reference to FIGS. 13 to 15.

FIG. 13 is a diagram in which the positions in plan view (referred to as "pre-correction positions") of a first pin P11 and a second pin P21 when the storage support body 12 is properly attached and the actual positions in plan view (referred to as "post-correction positions P12 and P22) of the first pin P11 and the second pin P21 in captured images obtained by the imaging process are plotted on the same plane.

As can be seen from this, the post-correction positions are shifted relative to the pre-correction positions by $\Delta z$ in the Z direction, and a virtual line KL1 overlapping the axis J1 at the pre-correction positions and a virtual line KL2 overlapping the axis J1 at the post-correction positions are inclined to each other in plan view by an angle $\Delta\theta$.

To calculate the positional offset amount in this case, first, the plane on which the pre-correction positions are plotted is manipulated to be rotated by an angle $\Delta\theta$ such that the virtual line KL1 and the virtual line KL2 are parallel, as shown in FIG. 14. Thereafter, as shown in FIG. 15, the plane is manipulated to be translated in the Z direction by $\Delta z$, thereby overlapping the first pin P11 at the pre-correction position with the first pin P12 at the post-correction position, and the second pin P21 at the pre-correction position with the second pin P22 at the post-correction position.

At this time, as shown in FIG. 15, the positional offset in the X direction of the proximal end portion of the transfer fork 25 that is calculated from the virtual line KL1 is $\Delta x2$, and the positional offset in the extension/retraction direction of the virtual line KL2 at the post-correction position is $\Delta z2$.

Accordingly, it is possible to correct the target stop position by correcting the preliminary target stop position with $\Delta x2$ and $\Delta z2$.

Alternative Embodiments (1) The above embodiment has described, as the correction process, an example in which the pre-learning process and the final learning process are successively executed for all storage sections S of the article storage racks 10A, and the DB stored position is updated and stored. However, it is also possible to adopt a configuration in which the pre-learning process and the final learning process are executed as the correction process for only designated storage sections S from among all storage sections S.

(2) Although the above embodiment has a configuration in which the height detection device K of a laser range-finding type is included in the learning device U2, a height detection device K that is of a type other than a laser range-finding type may be used. For example, it is possible to adopt a configuration in which a probe terminal is configured to be extensible downwardly, and the vertical distance between the transfer fork 25 and the storage support body 12 is measured by using the position at which the probe terminal comes into contact with the top surface of the storage support body 12. It is also possible that the height detection device K is included in the transfer fork 25, rather than in the learning device U2. Furthermore, it is possible to adopt a configuration in which the height detection device K is not provided in any of these components.

(3) Although the above embodiment has described a configuration in which the control portion H executes the offset amount calculation process based on the positions of the positioning pins P in the captured images, the offset amount calculation process may be executed based on the positions of components other than positioning pins P in the captured images. That is, it is possible to use, for example, the entire rectangular storage support body 12 provided with the cut-away portion 12K as the imaging target location, and execute the offset amount calculation process based on the shape of the storage support body 12. In this way, so long as a portion for which the offset amount can be determined is present on the captured images, the offset amount calculation process can be executed based on that portion.

Figure 16:
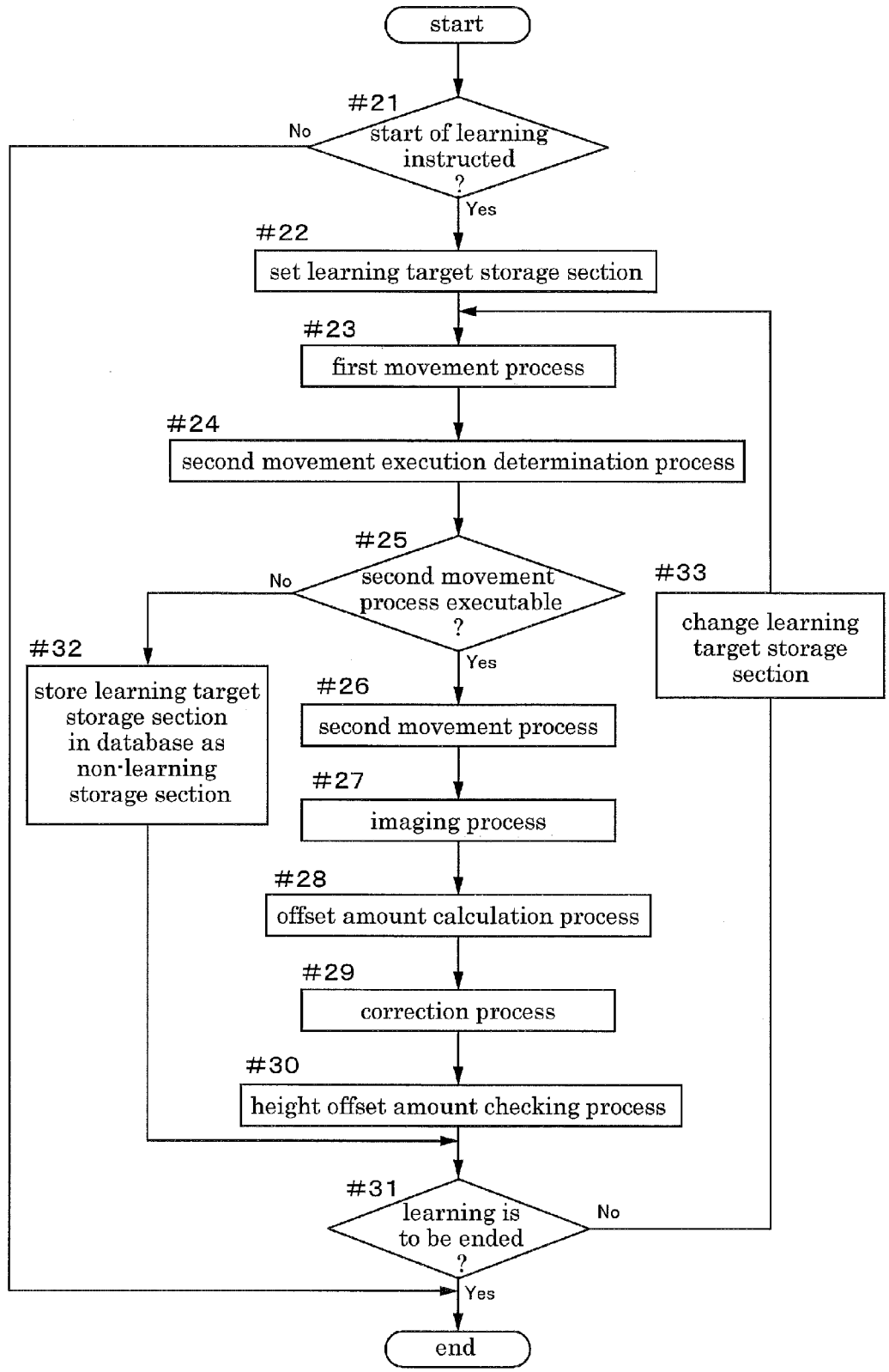
FIG. 16 is a flowchart showing another embodiment of the learning operation.

(4) It is possible to adopt a configuration in which the learning device U2 in the above embodiment includes a detection device for detecting that the positions in the Y direction and the X direction of the transfer fork 25 relative to the storage support body 12 are at a proper front position. As such a configuration, it is possible to use a laser detection device for detecting a reflective member attached to a predetermined location of the storage support body 12. With this configuration, it is possible to detect the proper front position based on the position of the reflective member. In this case, the learning operation can be a process shown in the flowchart of FIG. 16. In the flowchart, the processes from #13 to #16 in the flowchart of FIG. 12 are changed to the processes from #23 to #29 and #31. That is, a learning target storage section S is set (#22), and the first movement process is executed (#23). Then, after the execution of the first movement process and before the execution of the second movement process, a second movement execution determination process of determining whether the second movement process is executable, based on detection information from the detection device mounted to the transfer fork 25 is executed (#24).

If it is determined in the second movement execution determination process that the second movement process is executable (#25: Yes), then the second movement process (#26), the imaging process (#27), the offset amount calculation process (#28), and the correction process (#29) are subsequently executed. Subsequently, the control portion H executes the height offset amount checking process (#30) of FIG. 17.

If it is not determined in the second movement execution determination process that the second movement process is executable (#25: No), the storage support body 12 is stored in the database as a non-learning support body (#32), and the procedure proceeds to the process of #31. It is desirable that the storage support body 12 stored in the database as the non-learning support member is stored, for example, as a storage support body 12 that requires a repair, and the control portion H does not apply (select) the storage section S including that storage support body 12 as the storage section S as a storage target that stores the container B, unless the storage support body 12 is later repaired into a state in which it can be determined that the second movement process is executable therefor.

Note that in the case of acquiring the position in the X direction and the position in the Y direction as the preliminary target stop position by using the pre-learning device U1, it can be considered that the positions in the X direction and the Y direction for which the second movement process can be executed are updated and stored in the database by the pre-learning process. Accordingly, the second movement process may be executed subsequently to the first movement process, without execution of the second movement execution determination process at #24.

(5) The above embodiment and the alternative embodiment (4) have described an example in which the height offset amount calculated by the height offset amount calculation process is stored in association with the identification information of the storage section S, and, if the height offset amount calculated by the height offset amount calculation process is in an abnormal height state that is greater than an allowable amount, it is determined that the state of attachment of the storage support body 12 of the storage section is abnormal, and an indication to disable the storage section S is stored in the database. However, it is possible to adopt a configuration in which, in addition to such a process, if the height offset amount calculated by the height offset amount calculation process is not in an abnormal height state that is greater than an allowable amount, a height correction process of correcting the preliminary target stop position based on the height offset amount and setting the target stop position is executed.

Although the above embodiment and the alternative embodiment (4) have described a configuration in which the height offset amount checking process is executed in the learning process, it is possible to adopt a configuration in which the height offset amount checking process is not executed.

(6) Although the above embodiment has described an example in which the control portion H acquires, as the preliminary target stop position, the position in the X direction and the position in the Y direction that have been learned by the pre-learning device U1 in the learning process, the configuration is not limited thereto. For example, it is possible to adopt a configuration in which the position in the X direction and the position in the Y direction when the article storage racks 10A are designed are acquired as the preliminary target stop position, without performing learning by the pre-learning device U1.

Outline of the Embodiment

An outline of the article storage facility described above will be described below.

In an aspect, an article storage facility includes: an article storage rack including a plurality of storage sections arranged in a vertical direction and a lateral direction, each of the storage sections including a storage support body that supports an article from below; a movement support body that supports the article; a movement mechanism that moves the movement support body in the vertical direction and the lateral direction in a movement space provided along a front of the article storage rack, and moves the movement support body along a front-rear direction that is a direction of arrangement of the movement space and the article storage rack; and a control portion that controls the movement mechanism; wherein the control portion is configured to cause the movement mechanism to execute a movement operation of moving the movement support body to a target stop position that is set so as to correspond to each of the plurality of storage sections and stopping the movement support body at the target stop position, and a transfer operation of lowering the movement support body at the target stop position and delivering the article to the storage support body, the movement support body is configured such that an imaging device can be removably attached thereto, the imaging device is configured to, in a state in which the movement support body is at the target stop position, be controlled by the control portion so as to image from above an imaging target location that is set in the storage support body of the storage section corresponding to said target stop position, and the control portion is configured to execute: a preliminary movement process of causing the movement mechanism to execute a preliminary movement operation of moving the movement support body with the imaging device attached thereto to a preliminary target stop position that is preset as the target stop position and stopping the movement support body at the preliminary target stop position; an imaging process of causing the imaging device to image the imaging target location in a state in which the movement support body is stopped at the preliminary target stop position; an offset amount calculation process of calculating, based on a captured image obtained by the imaging process, a positional offset amount of the movement support body in the front-rear direction and the lateral direction from a proper position of the movement support body that is a position at which the article supported by the movement support body can be delivered to a proper storage position of the storage support body by the transfer operation; and a correction process of correcting the preliminary target stop position based on the positional offset amount calculated by the offset amount calculation process and setting the target stop position.

That is, the control portion executes the offset amount calculation process of calculating the positional offset amounts in the front-rear direction and the lateral direction of the movement support body from the proper position based on the captured image of the imaging target location imaged from above, with the movement support body to which the imaging device is mounted being stopped at the preliminary target stop position. Accordingly, in contrast to a configuration in which a target mark provided at the storage support body is imaged from the front of the article storage rack and the positional offset amounts in the front-rear direction and the lateral direction of the storage support body are detected based on the captured image, the imaging target location can include, for example, a portion of the storage support body at which an article is supported at the proper storage position, making it possible to accurately calculate the offset amount between the position and orientation in plan view of the storage support body that are defined by the preliminary target stop position and the position and orientation in plan view of the storage support body in the actually attached state.

Moreover, unlike Patent Document 2 above, it is not necessary to attach or remove the jig plate to or from the plurality of storage sections, and therefore, the operator does not need to attach a detection target jig to each storage support body, thus making it possible to reduce the burden on the operator.

Also, since the preliminary target stop position is corrected based on the positional offset amount that has been calculated accurately in the above-described manner, and the target stop position is set, it is possible to correct the target stop position to a position at which the movement support body can be located at the proper position.

In this way, it is possible to provide an article storage facility that can calculate the positional offset amount of the movement support body relative to the storage support body and correct the target stop position, while minimizing the burden on the operator.

Here, it is preferable that the movement support body includes a detection device that detects that a position in the vertical direction and a position in the lateral direction of the movement support body relative to the storage support body are at a proper front position that permits movement of the movement support body along the front-rear direction, the control portion is configured to: as the preliminary movement process, execute a first movement process of moving the movement support body in the vertical direction and the lateral direction and thereafter execute a second movement process of moving said movement support body in the front-rear direction; and, after execution of the first movement process and before execution of the second movement process, execute a second movement execution determination process of determining whether the second movement process is executable based on detection information from the detection device mounted to the movement support body, and the control portion starts execution of the second movement process if it is determined in the second movement execution determination process that the second movement process is executable, and does not start execution of the second movement process if it is determined that the second movement process is not executable.

The preliminary target stop position is set as a height at which the movement support body and the storage support body do not interfere with each other when the movement support body is moved to the storage support body side along the front-rear direction. However, due to, for example, a poor attachment precision of the storage support body, the storage support body may be present at a position at which the movement support body and the storage support body interfere with each other when the movement support body is moved to the storage support body side at a height corresponding to the preliminary target stop position.

In such a case, moving the movement support body toward the originally scheduled preliminary target stop position may cause a trouble such as a contact between the movement support body and the storage support body.

With the present configuration, as the preliminary movement process, the first movement process of moving the movement support body in the vertical direction and the lateral direction is executed, and thereafter the second movement execution determination process of determining whether the positions in the vertical direction and the lateral direction of the movement support body relative to the storage support body are at the proper front position based on the detection information from the detection device is executed. If it is determined in the second movement execution determination process that the second movement process is executable, the second movement process of moving the movement support body along the front-rear direction is executed. Accordingly, it is possible to execute the preliminary movement process without causing a trouble such as a contact between the movement support body and the storage support body.

Also, it is preferable that the storage support body includes a plurality of positioning members for positioning the article at the proper storage position, the plurality of positioning members are disposed so as to be distributed in plan view, the imaging device is configured to image the imaging target location by using a location in which a target positioning member included in the plurality of positioning members is provided as the imaging target location, and the control portion executes the offset amount calculation process based on an actual position of the target positioning member in the captured image, and a position of the target positioning member in the captured image that has been imaged with the imaging device when the movement support body is located at the proper position.

That is, the locations of the positioning members originally included in each storage support body for positioning an article at the proper storage position are imaged by the imaging device, and the offset amount calculation process can be executed based on captured images from the imaging device.

Accordingly, it is not necessary to provide a special configuration in the storage support body or the article storage rack including the storage support body in order to execute the offset amount calculation process, making it possible to suppress an increase in the cost of the facility for executing the offset amount calculation process.

Also, it is preferable that the movement support body includes a vertical distance measurement portion that measures a vertical distance that is a distance in the vertical direction between the movement support body located at the target stop position and the storage support body, and the control portion is configured to execute a height offset amount calculation process of calculating a height offset amount that is a difference between a proper distance that is a distance in the vertical direction between the movement support body located at the proper position and the storage support body and the vertical distance measured with the vertical distance measurement portion in a state in which the movement support body is located at the preliminary target stop position by the preliminary movement operation, and an abnormality determination process of determining whether the height offset amount calculated by the height offset amount calculation process is in an abnormal height state that is greater than an allowable amount.

That is, if the height offset amount calculated by the height offset amount calculation process is greater than the allowable amount, it can be assumed that the state of attachment of the storage support body is abnormal (e.g., the storage support body is inclined forward due to loosening of attachment screws). Accordingly, for example, even if the preliminary target stop position is corrected based on the above-described height offset amount, the storage support body may not be able to support an article appropriately.

Therefore, if it is determined in the abnormality determination process that the height offset amount is in the abnormal height state, it is possible, for example, to take measures, including notifying the operator that the storage support body is in need of a repair, and storing, in the database, an indication to prohibit the storage support body from supporting an article, without subsequently executing the process of correcting the preliminary target stop position based on the height offset amount and setting the target stop position, thus preventing a situation where an article is supported by a storage support body in an abnormal attachment state.

Also, it is preferable that the control portion is configured to, if it is determined in the abnormality determination process that the height offset amount is not in the abnormal height state, execute a height correction process of correcting the preliminary target stop position based on the height offset amount and setting the target stop position.

That is, if it is determined in the abnormality determination process that the height offset amount is not in the abnormal height state, it can be assumed that, even though the storage support body is shifted from a proper height, its attachment state is not abnormal. Accordingly, by correcting the preliminary target stop position based on the above-described height offset amount and setting the target stop position, it is possible to allow the movement support body to appropriately deliver an article to the storage support body by the transfer operation.

What is claimed is:

1. An article storage facility comprising:
an article storage rack including a plurality of storage sections arranged in a vertical direction and a lateral direction, each of the storage sections including a storage support body that supports an article from below;
a movement support body that supports the article;
a movement mechanism that moves the movement support body in the vertical direction and the lateral direction in a movement space provided along a front of the article storage rack, and moves the movement support body along a front-rear direction that is a direction of arrangement of the movement space and the article storage rack; and a control portion that controls the movement mechanism; wherein:

the control portion is configured to cause the movement mechanism to execute a movement operation of moving the movement support body to a target stop position that is set so as to correspond to each of the plurality of storage sections and stopping the movement support body at the target stop position, and a transfer operation of lowering the movement support body at the target stop position and delivering the article to the storage support body, the movement support body is configured such that an imaging device can be removably attached thereto, the imaging device is configured to, in a state in which the movement support body is at the target stop position, be controlled by the control portion so as to image from above an imaging target location that is set in the storage support body of the storage section corresponding to said target stop position, and the control portion is configured to execute:

a preliminary movement process of causing the movement mechanism to execute a preliminary movement operation of moving the movement support body with the imaging device attached thereto to a preliminary target stop position that is preset as the target stop position and stopping the movement support body at the preliminary target stop position;

an imaging process of causing the imaging device to image the imaging target location in a state in which the movement support body is stopped at the preliminary target stop position;

an offset amount calculation process of calculating, based on a captured image obtained by the imaging process, a positional offset amount of the movement support body in the front-rear direction and the lateral direction from a proper position of the movement support body that is a position at which the article supported by the movement support body can be delivered to a proper storage position of the storage support body by the transfer operation; and a correction process of correcting the preliminary target stop position based on the positional offset amount calculated by the offset amount calculation process and setting the target stop position.

2. The article storage facility according to claim 1, wherein the movement support body includes a detection device that detects that a position in the vertical direction and a position in the lateral direction of the movement support body relative to the storage support body are at a proper front position that permits movement of the movement support body along the front-rear direction, and wherein the control portion is configured to:

as the preliminary movement process, execute a first movement process of moving the movement support body in the vertical direction and the lateral direction and thereafter execute a second movement process of moving said movement support body in the front-rear direction; and, after execution of the first movement process and before execution of the second movement process, execute a second movement execution determination process of determining whether the second movement process is executable based on detection information from the detection device mounted to the movement support body, and the control portion starts execution of the second movement process if it is determined in the second movement execution determination process that the second movement process is executable, and does not start execution of the second movement process if it is determined that the second movement process is not executable.

3. The article storage facility according to claim 1, wherein:

the storage support body includes a plurality of positioning members for positioning the article at the proper storage position, the plurality of positioning members are disposed so as to be distributed in plan view, the imaging device is configured to image the imaging target location by using a location in which a target positioning member included in the plurality of positioning members is provided as the imaging target location, and the control portion executes the offset amount calculation process based on an actual position of the target positioning member in the captured image, and a position of the target positioning member in the captured image that has been imaged with the imaging device when the movement support body is located at the proper position.

4. The article storage facility according to claim 1, wherein:

the movement support body includes a vertical distance measurement portion that measures a vertical distance that is a distance in the vertical direction between the movement support body located at the target stop position and the storage support body, and the control portion is configured to execute a height offset amount calculation process of calculating a height offset amount that is a difference between a proper distance that is a distance in the vertical direction between the movement support body located at the proper position and the storage support body and the vertical distance measured with the vertical distance measurement portion in a state in which the movement support body is located at the preliminary target stop position by the preliminary movement operation, and an abnormality determination process of determining whether the height offset amount calculated by the height offset amount calculation process is in an abnormal height state that is greater than an allowable amount.

5. The article storage facility according to claim 4, wherein the control portion is configured to, if it is determined in the abnormality determination process that the height offset amount is not in the abnormal height state, execute a height correction process of correcting the preliminary target stop position based on the height offset amount and setting the target stop position.

* * * * *